(12) United States Patent
Fahimi et al.

(10) Patent No.: US 8,125,170 B2
(45) Date of Patent: Feb. 28, 2012

(54) TECHNIQUES AND APPARATUS FOR THE MEASUREMENT OF MUTUAL INDUCTANCE IN A SWITCHED RELUCTANCE MACHINE

(75) Inventors: Babak Fahimi, Arlington, TX (US); Umamaheshwar Krishnamurthy, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 776 days.

(21) Appl. No.: 12/140,232

(22) Filed: Jun. 16, 2008

(65) Prior Publication Data

US 2008/0315896 A1 Dec. 25, 2008

Related U.S. Application Data

(60) Provisional application No. 60/936,127, filed on Jun. 16, 2007.

(51) Int. Cl.
*H02P 6/00* (2006.01)
(52) U.S. Cl. .................. 318/400.35; 318/701; 318/721; 318/400.34
(58) Field of Classification Search ............. 318/400.01, 318/400.14, 400.32, 490, 515, 51, 400.33, 318/400.34, 400.35, 400.29, 701, 721, 727, 318/797, 459, 528; 388/907.2
See application file for complete search history.

(56) References Cited

U.S. PATENT DOCUMENTS

| | | | | |
|---|---|---|---|---|
| 5,459,385 A * | 10/1995 | Lipo et al. | ...................... | 318/701 |
| 6,246,193 B1 * | 6/2001 | Dister | ...................... | 318/400.33 |
| 6,555,977 B1 * | 4/2003 | Du et al. | .................. | 318/400.04 |
| 6,650,082 B1 * | 11/2003 | Du | ................................ | 318/701 |
| 7,002,318 B1 * | 2/2006 | Schulz et al. | ................. | 318/782 |
| 7,015,664 B2 * | 3/2006 | Coles et al. | ............. | 318/400.01 |
| 7,429,840 B2 * | 9/2008 | Pollock et al. | ............. | 318/254.1 |

OTHER PUBLICATIONS

H. H. Moghbelli, G. E. Adams, R. G. Hoft, "Prediction of the instantaneous and steady state torque of the switched reluctance motor using finite element method (FEM)," IAS annual meeting 1988, vol. 1, pp. 59-70.

M. Krishnamurthy, B. Fahimi, Chris S. Edrington, "On the measurement of mutual inductance for a switched reluctance motor," Power Electronics Specialists Conference, 2006. 2006 PESC '06 37th IEEE. Jun. 18-22, 2006. pp. 1-7.

* cited by examiner

*Primary Examiner* — Bentsu Ro
*Assistant Examiner* — Antony M Paul
(74) *Attorney, Agent, or Firm* — Chowdhury & Georgakis, P.C.

(57) ABSTRACT

A system and technique for measuring the mutual inductance in a switched reluctance machine (SRM). In a first example embodiment of the technique, a voltage pulse is applied to primary coil when the machine is stationery. By measuring current in the primary coil and measuring induced voltages in adjacent open circuited coils mutual inductance may be determined. In another example embodiment, a voltage pulse is applied to the primary coil when the machine is stationery. The secondary coil is allowed to freewheel current through the phase. By measuring time taken by the primary phase to reach a preset value, the mutual inductance for the known position of a rotor can be determined.

8 Claims, 5 Drawing Sheets

TECHNIQUES AND APPARATUS FOR THE MEASUREMENT OF MUTUAL INDUCTANCE IN A SWITCHED RELUCTANCE MACHINE

This application claims priority under 35 U.S.C. 119(e)(1) of provisional application No. 60/936,127, filed on Jun. 16, 2007, incorporated herein by reference in its entirety.

TECHNICAL FIELD OF THE INVENTION

The present invention generally relates to motors, and more specifically to switched reluctance motors.

BACKGROUND OF THE INVENTION

Several mission critical products in military and aerospace applications require high-precision controllers on switched reluctance machines in order to function safely and properly. ("reluctance motor" and "reluctance machine" are used interchangeably). A majority of controllers in use today assume an ideal inductance profile while ignoring mutual effects. However, an ideal analytical model needs to incorporate up-to-date information about machine dynamics including a very accurate parameter identification and compensation technique.

The design, control and analysis of a switched reluctance machines require detailed information about the flux-linkage characteristics of the windings for various rotor positions and current levels. Presently, research conducted towards estimation of torque, position and other machine parameters for the switched reluctance machine tend to ignore the effects of mutual coupling between different phases owing to the concentrated windings around the stator poles. The effects of mutual inductance on the performance of the machine have been addressed by researchers in the past. For example, Moghbelli et al. reported an error up to 7% in the estimated flux-linkage owing to this approximation.

While these assumptions may be reasonable in a few industrial applications, they cannot be used for high performance systems, such as military and aerospace applications. It follows that a more accurate model of the switched reluctance machine is desirable which eliminate said errors. Ideally, it is desired to obtain the mutual inductance using terminal measurements (i.e. voltages, currents and time) with no extra hardware or memory.

SUMMARY OF THE INVENTION

The present invention solves current problems associated with the measurement and estimation of mutual inductance in switched reluctance machines. In a first example embodiment of the technique, a voltage pulse is applied to primary coil when the machine is standstill. By measuring current in the primary coil and measuring induced voltages in adjacent open circuited coils mutual inductance can be determined.

In a second example embodiment, the present invention as disclosed in the claims, a voltage pulse is applied to the primary coil when the machine is standstill. The secondary coil is allowed to freewheel current through the phase. By measuring time taken by the primary phase to reach a preset value, the mutual inductance for the known position of the rotor can be determined.

In another embodiment, a system for measuring mutual inductance in a switched reluctance motor (SRM) is illustrated. The system comprises an index head operably coupled to the SRM to determine a rotor position, wherein the SRM includes a primary coil; a voltage source operably coupled to the SRM; an oscilloscope operably coupled to the primary coil of the SRM; and control circuitry operably coupled to the SRM, said control circuitry determining mutual inductance for a position of the rotor of the SRM.

In a yet another embodiment, a method of making the SRM a fault tolerant machine is disclosed. A primary phase is energized with a voltage to induce an excitation current. An idle phase is continuously monitored to diagnose by measuring voltage and current response to the excitation. Whenever a sensor position failure is detected, commutation instant is estimated using mutual inductance. In this event of position sensor error detection, the SRM control is switched to sensorless control.

NOTATION AND NOMENCLATURE

Certain terms are used throughout the following description and claims to refer to particular system components and configurations. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF PREFERRED EMBODIMENTS

Figure 1:
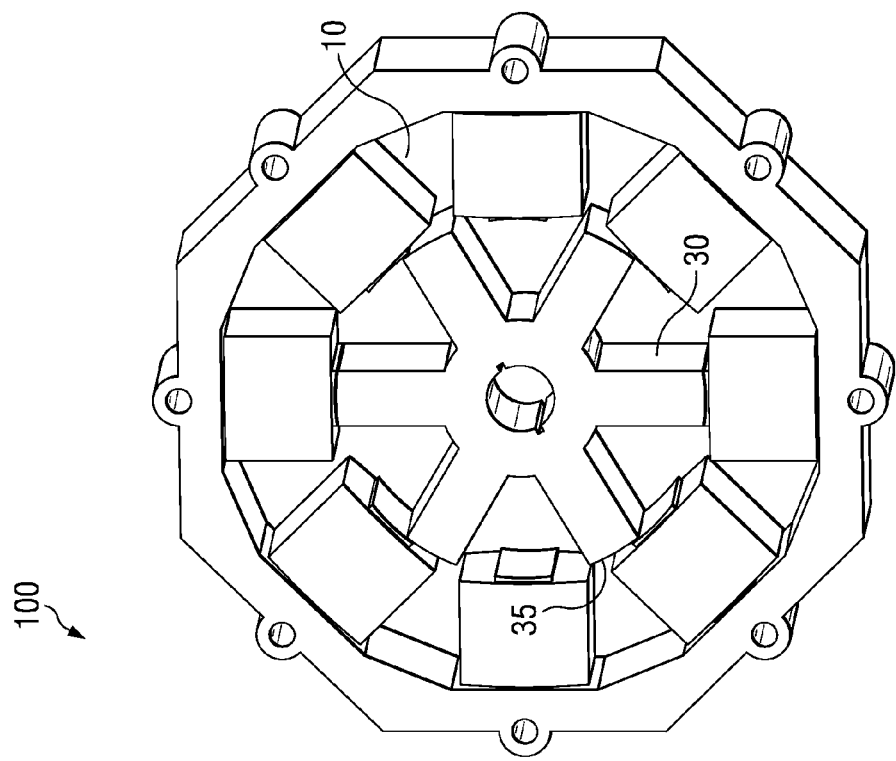
FIG. 1 is a perspective diagram of a section of a Switched Reluctance Motor.
Figure 1:
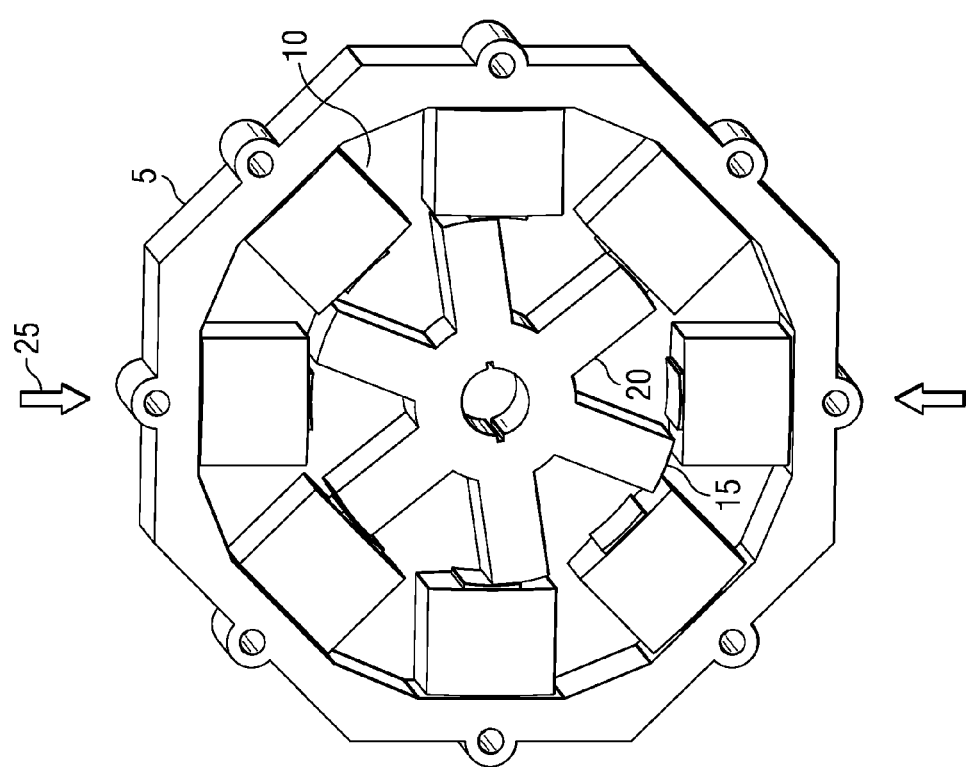

Referring to FIG. 1, a perspective diagram of a section of a Switched Reluctance Motor 100 (SRM). An SRM comprises of a stator 5 and a rotor 20. A stator comprises of several coils 10. In the example embodiment, the stator comprises eight coils. Also, in the example embodiment the rotor comprises six magnetic poles. This example embodiment is typically referred to as 8/6 SRM configuration. Apparently, several motor configurations are feasible in practice. The analysis and description herein generally refers to the 8/6 SRM configuration which can be adapted for other motor configurations.

Switched reluctance motors are often operated with a phase overlap, which results in higher torque and lower pulsation. A pattern of excitation in which there is a very low flux density between the excited phases is called "long flux path excitation (LFPE)". The other excitation scheme is called "short flux path excitation (SFPE)" wherein the flux path closes its loop through the adjacent phase. In an n-phase switched reluctance machine, there exist n−1 LFPE and one SFPE in every electrical cycle. There are some significant differences observed in the performance of the machine for each mode of operation. When a short flux path is followed, there is a substantial increase in the electromagnetic torque.

In order to accurately model the machine, mutual inductance must be characterized for the cases in which the machine is saturated in the stator/rotor poles and stator back-iron. One may model the mutual inductance by a truncated Fourier series expansion. It must be noted that the effects of mutual inductances are more salient when the machine starts to saturate. This is due to the fact that mutual inductance with a phase 90 degrees apart would be very small due to a dominant air-gap, non-existence of mutual flux path, as well as a lack of coupling between windings. Therefore mutual inductance can be represented as:

$$M(\theta, i) = \sum_{n=0}^{2} M_n(i) \cos(n N_r \theta + \phi^*) \quad (1)$$

Detection of mutual inductance is used for estimation of rotor position in real time applications. Once the model of the mutual inductance is determined, it will be stored in the controller. By real time detection of the mutual inductance, and given the fact that coefficients of the mutual inductance are known, equation (1) will be solved to compute the rotor position. Detection of rotor position will remove the need for external position sensors which are known to be a source for additional cost, real estate and, lack of reliability.

For known currents and rotor position, equation 1 has four unknowns—M0, M1, M2 and $\phi^*$. $\phi^*$ is the phase shift and is a function of the geometry of the machine.

Therefore, by measuring mutual inductance at aligned, unaligned and midway positions, the value of the coefficients M0, M1 and M2 can be found by mathematical manipulations. The magnitude of the mutual inductance may change drastically due to the formation of a short flux path within an electric cycle. This in turn would introduce an asymmetry in the profile that has not been mathematically reflected in the above expression.

By definition, torque is defined as the derivative of co-energy with respect to position for a given value of current. Therefore, when electromagnetic torque production is defined as a function of the superposition of singly excited phases, there is a considerable overestimation of that torque due to the use of only self-inductances in the calculation. Thus, utilizing a model that is based only on the self-inductances can lead to a substantial error. This disclosure presents an accurate technique for the detection of mutual inductance in the machine as described in the following sections.

Figure 2:
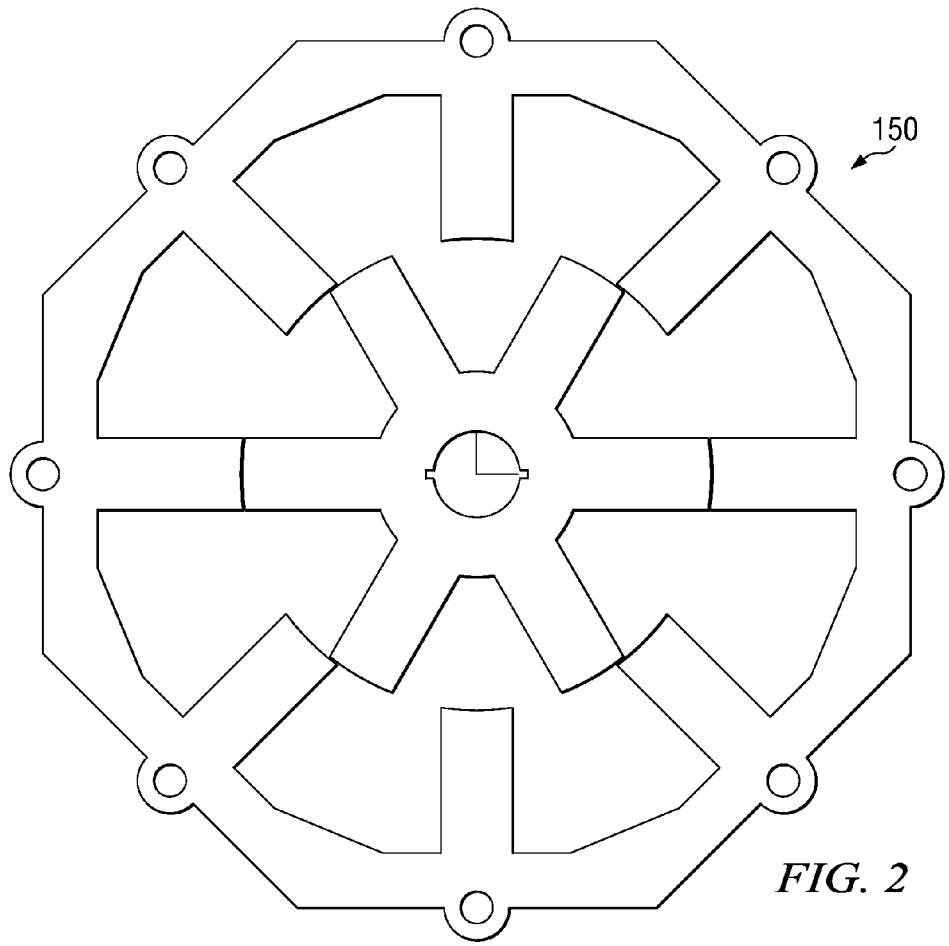
FIG. 2 is a perspective drawing showing the B-field distribution for an arbitrary rotor position.

In order to assess the feasibility of the one embodiment of the present invention, a detailed simulation of the switched reluctance machine system was performed. A finite element model of the switched reluctance machine was constructed using the known geometry of the machine. FIG. 2 shows the FE model of the machine 150.

Figure 3:
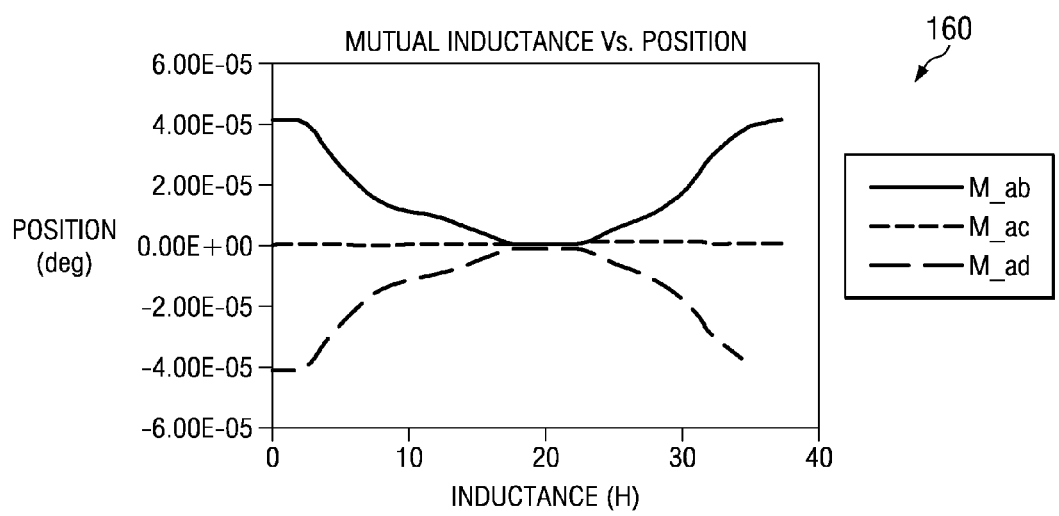
FIG. 3 is a line graph depicting a representative response of mutual inductances for varying rotor positions.

This finite element model was supplied with a pulse of voltage and the current response of the phase was measured. Additionally, the voltage induced in the adjacent phases was measured and the mutual inductance was calculated as described below. FIG. 3 shows the variation of mutual inductance 160 for different rotor positions obtained from both methods.

Now we analyze the problem of inductance estimation by Induced voltage measurement. The phase voltage equation for a switched reluctance machine has three components—resistive drop, inductive drop across the coils and the motional back-emf as given by equation:

$$V = ri + L(\theta) \frac{di}{dt} + \omega i \frac{dL}{d\theta} \quad (2)$$

where v, r, i, L and θ denote phase voltage, stator resistance, phase current, phase self-inductance, and rotor position respectively. As can be gleamed from the equation presented above, inductance is therefore a function of rotor position. While the switched reluctance machine is at a standstill, motional back-emf in a stator phase equals zero.

This simplifies the phase voltage equation to the following:

$$V = ri + L(\theta_0) \frac{di}{dt} \quad (3)$$

where $\theta_0$ denotes the initial rotor position of the switched reluctance machine at standstill. When a phase is excited with a voltage pulse and current flows through the conductor, a magnetic field is created in accordance with Ampere's law. This field links with the adjacent coils and generates an induced voltage. This generated voltage in phase 'x' can be linked to the current flowing in the primary coil as given in the following equation:

$$v_x = M_{1x}(\theta_0) \frac{di_1}{dt}, \quad x = b \ldots d \quad (4)$$

where M denotes mutual inductance between phase 1, i.e. the excited phase and the remaining three phases for an 8/6 machine configuration. Therefore, it follows that the knowledge of induced voltage ($V_x$) in any of the secondary coils and measurement of the current flowing through the primary coil allows for the estimation of the mutual inductance for a given position.

The adjacent phase (referred to as the secondary phase) is left open circuited and a voltage pulse is applied to the excited phase (referred to as the primary phase). The value of threshold current is chosen such that the drop across the resistor could be neglected and current in the phase increases linearly. The linear profile of the current waveform induces a voltage in the adjacent phase. Knowledge of the time required for current to rise in the primary phase to this threshold modifies equation (4) to the following form:

$$M_{1x} = v_x \frac{T}{I_{th}}, x = b \ldots d \quad (5)$$

where $I_{th}$ is the set threshold value and T is the time required by the phase to build up to this value.

Figure 4:
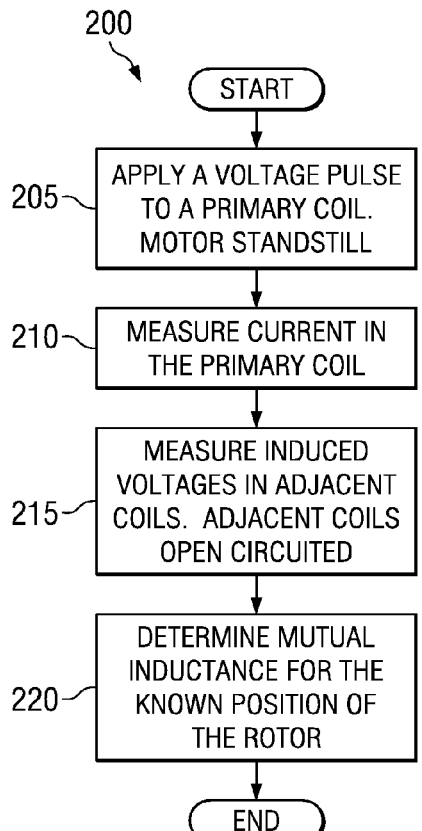
FIG. 4 is a block diagram of one embodiment of the method of determining mutual inductance of a Switched Reluctance Motor for a known position of the rotor.

Now referring to FIG. 4 is shown a block diagram 200 of second embodiment of the method of determining mutual inductance of a Switched Reluctance Motor for a known position of the rotor. According to this embodiment of the method, a voltage pulse is applied to a primary coil when the motor is at a standstill 205. The voltage pulse is typically a square pulse. Consequentially a current flows in the primary coil. This current in the primary coil 210 is measured. The voltage pulse applied to the primary coil also induces voltage in the adjacent coils. Induced voltages in the adjacent coils are measured 215 while these adjacent coils are in open circuit position. Mutual inductance is then determined 220 using the measured current in the primary coil and measured voltages in the adjacent coils for the known position of the rotor.

Figure 5:
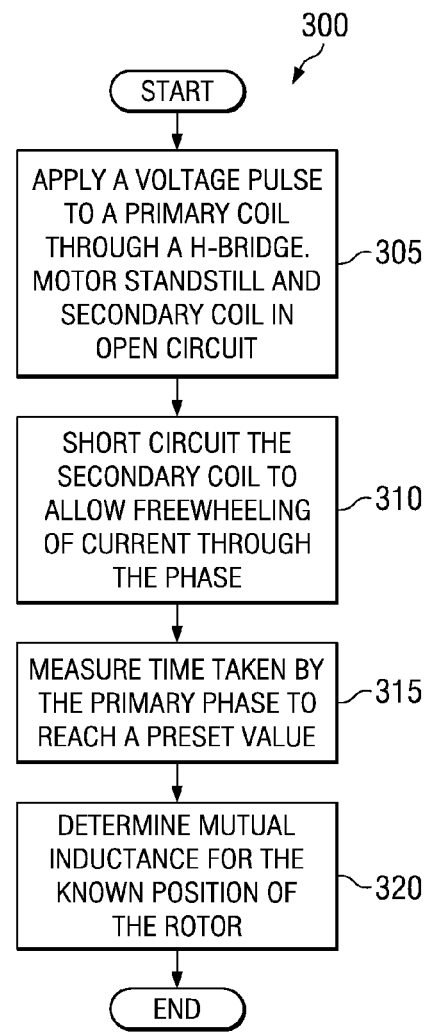
FIG. 5 is a block diagram of the second embodiment of the method of determining mutual inductance of a Switched Reluctance Motor for a known position of the rotor.

Now referring to FIG. 5 is a block diagram of another embodiment 300 of the method of determining mutual inductance of a Switched Reluctance Motor for a known position of the rotor. A voltage pulse is applied to a primary coil through an H-bridge converter configuration circuit (shown in FIG. 8) 305. The motor is in standstill position and the secondary coils are open circuited. At this moment the secondary coil is short circuited 310 momentarily to allow freewheeling of current through the phase. At this stage, if the value of the current flowing through the primary phase is known, measuring time taken by the primary phase to reach a preset value 315, then allows determination of the mutual inductance of the phase 320 by measuring the slope of the current in the secondary phase.

Figure 6:
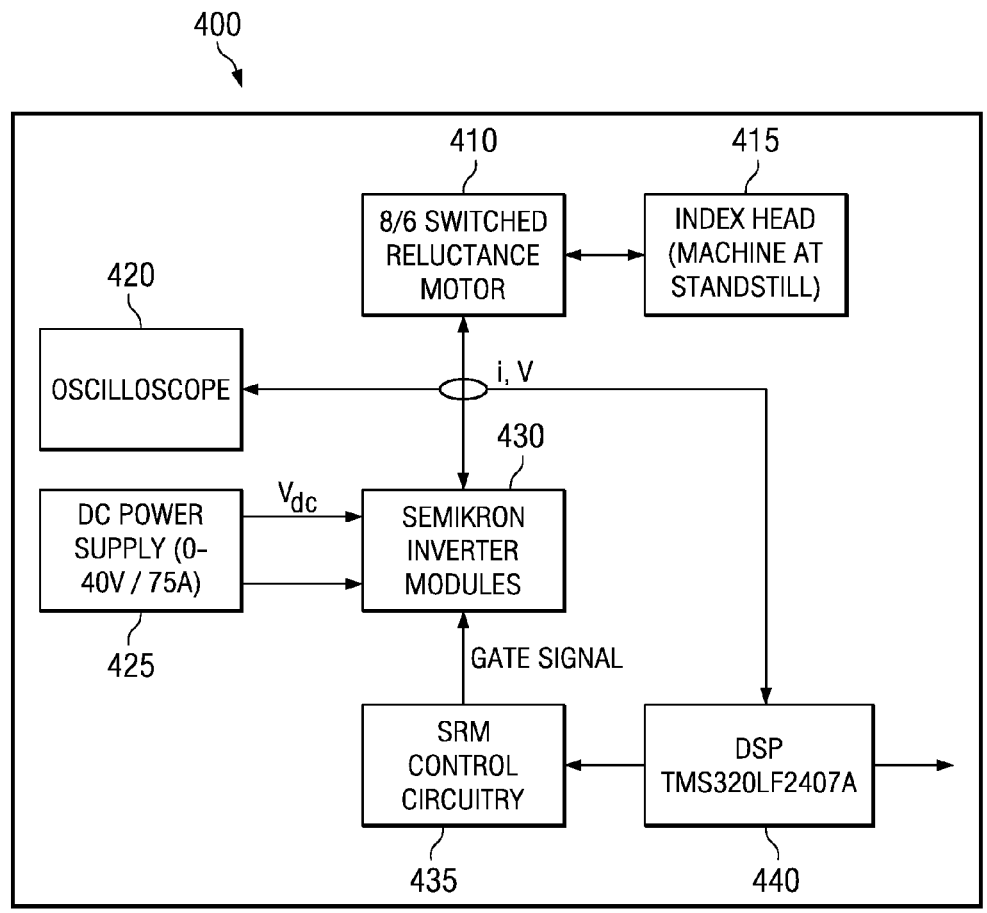
FIG. 6 is a Hardware setup for estimation of the mutual inductance.

FIG. 6 shows the hardware setup 400 for the implementation of each of the methods discussed above and the system thereof. The hardware portion of the system is comprised of an 8/6, 2 [kW], 42[V] switched reluctance motor drive 410 with desired parameters which is supplied by a 4-phase asymmetric bridge converter 430. The drive control 435 was established using a DSP controller 440 that offers a 10-bit analog to digital conversion with a rate of 800 n/sec along with a speed of 40 millions of instructions per second. An oscilloscope 420 is provided to record and monitor voltages and currents in various coils. While particular components of the system are specifically provided above, it must be mentioned that the present method can also be extended to measure mutual inductance in machines with different configurations.

Figure 7:
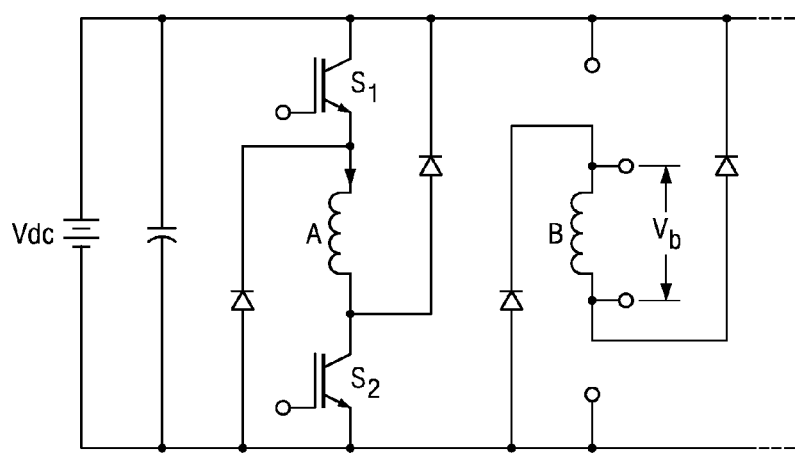
FIG. 7 is a converter setup used to implement one embodiment of the present invention.

FIG. 7 shows the converter setup 430 used to implement embodiment of FIG. 4. This method has the added advantage of using duration of the applied pulse to calculate inductance. This can be measured from the internal CPU clock, thereby enhancing precision. It can be observed that the voltage in the secondary phase follows a similar profile as the applied excitation voltage.

Figure 8:
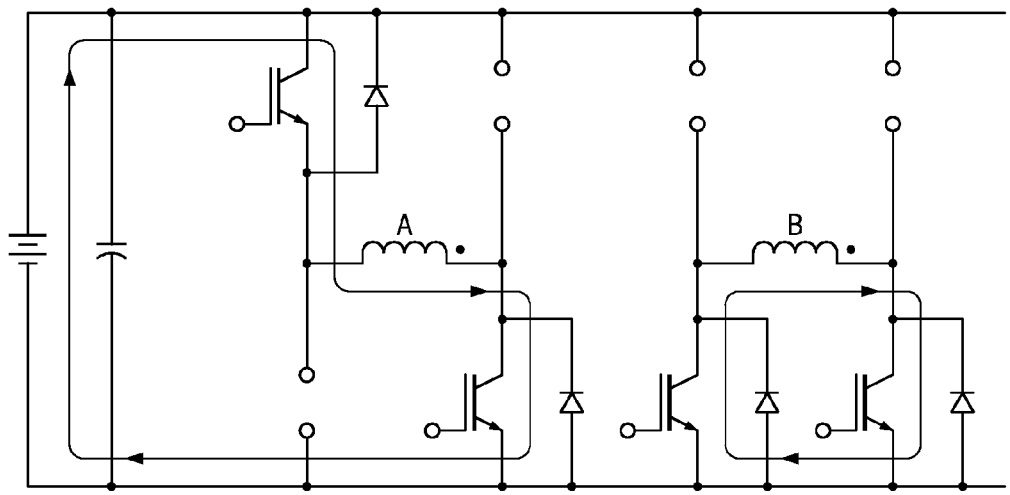
FIG. 8 is a converter configuration of freewheeling scheme of mutual inductance determination (H-bridge configuration).

FIG. 8 shows a converter configuration 430 of freewheeling scheme of mutual inductance determination (H-bridge configuration). As noted above this configuration is used for implementing the embodiment of FIG. 5.

Figure 9:
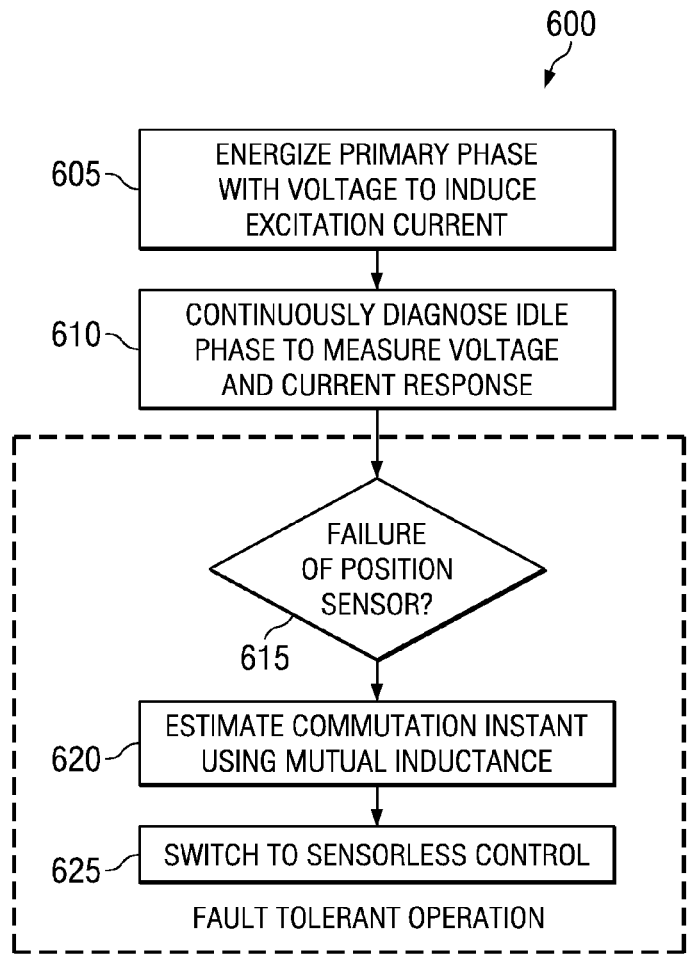
FIG. 9 is a schematic diagram showing a method for making a fault tolerant SRM.

The embodiments of the invention can also be used to form a fault tolerant control system as shown in FIG. 9. Under normal condition, when external position sensors are in function, the rotor position will be detected using online monitoring of mutual inductance. If the position sensor fails, this alternative estimate of the rotor position will automatically engage and keeps the system in service seamlessly. The later is of great interest in high impact applications.

In the method to form a fault tolerant system 600 for an SRM, a primary phase is energized with a voltage to induce an excitation current 605. An idle phase is continuously monitored to diagnose 605 by measuring voltage and current response to the excitation. Whenever a sensor position failure 615 is detected, commutation instant is estimated 620 using mutual inductance. In this event of position sensor error detection, the SRM control is switched to sensorless control 625.

While the present invention has been described with respect to a limited number of embodiments, those skilled in the art will appreciate numerous modifications and variations therefrom. It is intended that the appended claims cover all such modifications and variations as fall within the true spirit and scope of this present invention.

REFERENCES

1. H. H. Moghbelli, G. E. Adams, R. G. Hoft, "Prediction of the instantaneous and steady state torque of the switched reluctance motor using finite element method (FEM)", IAS annual meeting 1988, Vol. 1, pp 59-70, incorporated herein by reference in its entirety.
2. M. Krishnamurthy, B. Fahimi, Chris S. Edrington "On the measurement of mutual inductance for a switched reluctance motor" Power Electronics Specialists Conference, 2006. 2006 PSEC'06 37th IEEE. 18-22 Jun. 2006 Pages 1-7, incorporated herein by reference in its entirety.

What is claimed is:

1. A method of determining mutual inductance in a switched reluctance machine, the method comprising:
   exciting a primary phase with a voltage pulse applied to a primary coil through a H-bridge when the machine is stationary and a secondary coil in open circuit state;
   short-circuiting simultaneously the secondary coil for a short duration allowing freewheeling of the current through the phase;
   measuring time taken by the primary phase to reach a preset value; and
   determining mutual inductance between the primary coil and adjacent coils for a given position of a rotor of the machine.

2. The method of claim 1, wherein the mutual inductance comprises the mutual inductance between the excited phase and the remaining phases.

3. The method of claim 1, wherein the voltage pulse comprises a high frequency voltage pulse of certain amplitude and duration so as to cause a rise in the current.

4. The method of claim 1, wherein the preset value allows freewheeling of the current through the phase.

5. A method of forming a fault tolerant system for a switched reluctance machine (SRM), the method comprising:
   applying voltage to generate a primary phase to induce an excitation current;
   diagnosing continuously an idle phase to measure voltage and current response;
   detecting failure of a rotor position sensor when the rotor position sensor fails;
   estimating rotor position upon failure of the rotor position sensor using mutual inductance, wherein determining mutual inductance in the SRM comprises:
   exciting a primary phase with a voltage pulse applied to a primary coil when the machine is stationary;
   measuring current in the primary coil;

measuring induced voltages in adjacent coils, wherein adjacent coils are open circuited; and determining mutual inductance between the primary coil and adjacent coils for a given position of a rotor of the machine;

continuously estimating rotor position using the determined mutual inductance between primary coil and adjacent coils; and switching to sensorless control upon failure of the position sensor.

6. The method of claim 5, wherein the primary phase may be any phase.

7. The method of claim 6, wherein the sensorless control comprises any control system.

8. A method of forming a fault tolerant system for a switched reluctance machine (SRM), the method comprising:

applying voltage to generate a primary phase to induce an excitation current;

diagnosing continuously an idle phase to measure voltage and current response;

detecting failure of a rotor position sensor when the rotor position sensor fails;

estimating rotor position upon failure of the rotor position sensor using mutual inductance, wherein determining mutual inductance in the SRM comprises:

exciting a primary phase with a voltage pulse applied to a primary coil through a H-bridge when the machine is stationary and a secondary coil in open circuit state;

short-circuiting simultaneously the secondary coil for a short duration allowing freewheeling of the current through the phase;

measuring time taken by the primary phase to reach a preset value;

determining mutual inductance between the primary coil and adjacent coils for a given position of a rotor of the machine; and switching to sensorless control upon failure of the position sensor.

* * * * *